(12) United States Patent
Uchida et al.

(10) Patent No.: US 7,960,070 B2
(45) Date of Patent: Jun. 14, 2011

(54) ELECTROCATALYST FOR ETHANOL OXIDATION AND DIRECT ETHANOL FUEL CELL USING THE SAME

(75) Inventors: Isamu Uchida, Miyagi (JP); Minoru Umeda, Niigata (JP); Hiroyuki Ojima, Shizuoka (JP)

(73) Assignees: Isamu Uchida, Sendai-shi (JP); Ricoh Company, Ltd., Tokyo (JP); Tohoku Ricoh Co., Ltd., Shibata-gun (JP)

(*) Notice: Subject to any disclaimer, the term of this patent is extended or adjusted under 35 U.S.C. 154(b) by 1047 days.

(21) Appl. No.: 11/755,445

(22) Filed: May 30, 2007

(65) Prior Publication Data

US 2008/0032885 A1 Feb. 7, 2008

Related U.S. Application Data

(63) Continuation of application No. 10/682,120, filed on Oct. 10, 2003, now abandoned.

(30) Foreign Application Priority Data

Oct. 11, 2002 (JP) .................................. 2002-298138
Oct. 2, 2003 (JP) .................................. 2003-344727

(51) Int. Cl.
*H01M 8/10* (2006.01)
*H01M 4/92* (2006.01)

(52) U.S. Cl. ........................... 429/506; 429/524; 429/526

(58) Field of Classification Search ........................ None
See application file for complete search history.

(56) References Cited

U.S. PATENT DOCUMENTS

| 5,132,193 | A | 7/1992 | Reddy et al. |
| 5,773,162 | A | 6/1998 | Surampudi et al. |
| 5,958,616 | A | 9/1999 | Salinas et al. |
| 2002/0076589 | A1 | 6/2002 | Bostaph et al. |

FOREIGN PATENT DOCUMENTS

| EP | 0 838 872 | 4/1998 |
| EP | 1 134 830 | 9/2001 |
| EP | 1 175 948 | 1/2002 |
| JP | 10-302810 | 11/1998 |
| JP | 2001-15121 | 1/2001 |
| JP | 2001-15122 | 1/2001 |
| JP | 3351285 | 11/2002 |
| WO | WO 94/07274 | 3/1994 |
| WO | WO 02/075893 | 9/2002 |
| WO | WO 03/081702 | 10/2003 |

OTHER PUBLICATIONS

Machine translation of JP 2001-015121, Jan. 2001.*
W. Zhou et al., "Pt based anode catalysts for direct ethanol fuel cells," Applied Catalysis B: Environmental 46 (Jul. 2003), 273-285.*
Y. Kotoage, et al., Industry and Electricity, pp. 19-25, No. 547, 1998.

(Continued)

*Primary Examiner* — Jonathan Crepeau
(74) *Attorney, Agent, or Firm* — Oblon, Spivak, McClelland, Maier & Neustadt, L.L.P.

(57) ABSTRACT

An electrocatalyst for ethanol oxidization includes an elemental mixture containing platinum and ruthenium and at least one element, wherein the foregoing at least one element is selected from the group of tungsten, tin, molybdenum, copper, gold, manganese, and vanadium.

15 Claims, 6 Drawing Sheets

OTHER PUBLICATIONS

D.S. Cameron, Platinum Metals Rev., pp. 28-31, No. 47, (1), "Fuel Cells—Science and Technology 2002", 2003.

J. P. I., Souza, Journal of Electroanalytical Chemistry 420, pp. 17-20, "Performance of a CO-Electrodeposited Pt—Ru Electrode for the Electro-Oxidation of Ethanol Studied by in Situ FTIR Spectroscopy", 1997.

C. Lamy, et al., Journal of Power Sources 105, pp. 283-296, "Recent Advances in the Development of Direct Alcohol Fuel Cells (DAFC)", 2002.

C. Lamy, et al., Journal of Applied Electrochemistry 31, pp. 799-809, "Electrocatalytic Oxidation of Aliphatic Alcohols:Application to the Direct Alcohol Fuel Cell (DAFC)", 2001.

Y. Zhu, et al., Langmuir, vol. 17, No. 1, pp. 146-154, "Attenuated Total Reflection-Fourier Transform Infrared Study of Methanol Oxidation on Sputtered Pt Film Electrode", 2001.

S. Wasmus, et al., Journal of Electroanalytical Chemistry 461, pp. 14-31, "Methanol Oxidation and Direct Methanol Fuel Cells: A Selective Review", 1999.

H. A. Gasteiger, et al., Electrochimica Acta, vol. 39, No. 11/12, pp. 1825-1832, "Electro-Oxidation of Small Organic Molecules on Well-Characterized Pt—Ru Alloys", 1994.

Y. Fujita, et al., The Battery debate lecture, pp. 3-6, "Power-Generation Characteristics of a Direct Ethanol Fuel Cell", 2001.

\* cited by examiner

80

ELECTROCATALYST FOR ETHANOL OXIDATION AND DIRECT ETHANOL FUEL CELL USING THE SAME

CROSS-REFERENCE TO RELATED APPLICATIONS

This application is a continuation of U.S. patent application Ser. No. 10/682,120, filed on Oct. 10, 2003 now abandoned, which claims priority to Japanese Patent Application No. 2003-344727, filed on Oct. 2, 2003, and Japanese Patent Application No. 2002-298138, filed on Oct. 11, 2002.

BACKGROUND OF THE INVENTION

The present invention generally relates to fuel cells and more particularly to a novel anode electrocatalyst for use in a fuel cell. The present invention particularly relates to a high-output fuel cell of the type that supplies fuel containing ethanol as a principal ingredient directly to an anode and to the electrocatalyst that can efficiently oxidize such a fuel containing ethanol as the principal ingredient and supplied directly to the anode. Further, the present invention relates to an electronic device that uses such a fuel cell.

The fuel cell that uses a fuel of hydrogen gas can provide a high output power density, and a polymer electrolyte fuel cell (PEFC) of the type that uses a hydrogen gas as the fuel is expected as the power supply of high speed vehicles such as an electric vehicle (EV) or distributed type power supply system.

Generally, a PEFC uses a cell unit formed of a junction assembly (membrane-electrode assembly: MEA) of a fuel electrode (anode) and an oxygen electrode (cathode) sandwiching a proton exchange membrane (PEM) therebetween. A PEFC is generally constructed in the form of a stack in which a plurality of such cell units are stacked in plural layers.

In such a cell unit, electromotive force (EMF) is obtained by inducing an oxidation reaction and a reduction reaction at the respective electrodes by supplying hydrogen to the anode as a fuel and oxygen or the air to the cathode as an oxidizer. In order to enhance the electrochemical reaction, a platinum catalyst is used in these electrodes, and protons (hydrogen ions) formed at the anode are transported to the cathode through the PEM.

However, such a fuel cell that uses PEFC cannot be utilized effectively by the public unless infrastructure for hydrogen gas fuel supply is deployed. Further, there are many problems to be solved in the technology of PEFC that uses hydrogen gas as a fuel in relation to the storage and transport of the hydrogen fuel and the technology of handling the hydrogen fuel safely. Because of this, it is now recognized that the use of hydrogen fuel is not suitable for the electric power supply of small electronic apparatuses or portable electronic apparatuses of personal use.

In order to overcome these problems, intensive investigations are being made on the fuel cell of so-called reforming type that produces hydrogen by reforming a hydrocarbon fuel such as a liquefied natural gas (LNG) or a methane gas or a liquid fuel such as methanol.

In the fuel cell of the type that reforms such hydrocarbon fuel, however, it is generally not possible to completely eliminate the formation of carbon monoxide (CO) or other impurities from the hydrogen fuel gas during the reformation process of the raw fuel. Such impurities, particularly CO, cause damaging effect to the function of the fuel cell.

The art of reforming for obtaining hydrogen from a methane gas or methanol is the technology of old and an example of this technology will be explained below for the case of using methanol.

As the reformation method of methanol, steam reformation (STR) method and auto thermal reformation method are well known.

The outline of the STR method is shown in FIG. 1.

Referring to FIG. 1, the vapor reformation process of methanol uses the reaction,

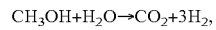

$$CH_3OH + H_2O \rightarrow CO_2 + 3H_2,$$

and includes a reformation step (Steam Reforming) 101 and a CO reduction (CO Removal) step 102.

Here, the CO reduction process 102 includes an $H_2/CO$ ratio adjustment process 102A that uses a water gas shift (WGS) reaction and a CO removal process 102B called a partial oxidation reaction process or preferential oxidation (PROX) process.

With this conventional art, the concentration of CO in the hydrogen gas fuel is reduced to below 100 ppm. Further, it is reported that a CO concentration of 10 ppm or less is possible (Kotoue Y., et al., Sangyo To Denki 547, 19, 1998; Donald S. Cameron, Fuel Cells—Science and Technology 2002, Platinum Metals Rev., 2003, 47, (1), 28-31).

With regard to the impurity concentration level of the hydrogen fuel obtained by the reformation of methanol fuel, empirical and analytical predictions are presented for the hydrogen gas fuel as follows.

TABLE 1

| | |
|---|---|
| $H_2$ | 72% |
| $CO_2$ | 24% |
| $N_2$ | 4% |
| CO | 50~100 ppm |
| $O_2$ | 0.5% |
| $CH_4$ | t.q. (trace quantity) |
| $HCOOCH_3$ | t.q. |
| HCOOH | t.q. |
| $CH_3OH$ | t.q. |

It should be noted that Table 1 shows the impurity concentration level in the hydrogen fuel of dry state for the case all the processes from the STR process 101 to the PROX process 102B are applied to the methanol in the reformation process of FIG. 1.

Thus, it can be seen that CO is contained in the reformed gas fuel with the concentration of 50-100 ppm, while other impurities can be disregard except for nitrogen and oxygen.

It is recognized that CO causes deactivation of platinum catalyst and causes damages on the function of the anode electrocatalyst of the fuel cell, and hence the power generation performance of the fuel cell. This effect is known as catalyst poisoning and can occur even when the concentration is 10 ppm or less.

In order to overcome this problem of catalyst poisoning, various technologies are proposed.

For instance, there is proposed a technology that uses platinum-ruthenium (Pt—Ru) alloy catalyst in place of the platinum catalyst for reducing the catalyst poisoning. It is recognized that this technology can successfully prevent the adsorption of CO molecules, which may be contained in the hydrogen gas with several ppm to several ten ppm as impurities and act as a catalyst poison to the platinum surface, thereby reducing the deactivation of the platinum catalyst action.

Aiming for further reduction of the catalyst poisoning in the fuel cell electrode reaction (referred to hereinafter as "reformed gas fuel"), following technologies are proposed.

Japanese Laid-Open Patent Application 10-228912 describes an improved catalyst that uses an assembly of a metal oxide, platinum and a transition element disposed close with each other, or an assembly of a metal oxide, platinum and an element of Group IIIa or IVa, with regard to a reformed gas fuel (Reformate).

Furthermore, Japanese Laid-Open Patent Publication 8-501653 refers to U.S. Pat. Nos. 3,297,484 and 3,369,886 in relation to general construction of catalyst, wherein these references disclose the technological information of various catalyst compositions of metals, metal oxides, metal alloys, metal compounds in relation to the application of new ion exchange membrane to the technology of fuel cell.

Furthermore, Japanese Patent 3,351,285 proposes a catalyst mixture formed of a platinum catalyst, a platinum-ruthenium multicomponent catalyst and a platinum-molybdenum multicomponent catalyst carried separately on a single carbon carrier for use as an anode electrocatalyst capable of reducing the catalyst poisoning caused by CO in a reformed gas fuel.

Japanese Laid-Open Patent Application 10-302810 proposes a catalyst that contains platinum or a platinum alloy and a Lewis acid (solid acid) containing a rare earth metal element as the anode electrocatalyst capable of reducing the poisoning caused by CO in a reformed gas fuel. In this reference, a multicomponent alloy of platinum, a platinum group element and also other metal element is used for the foregoing platinum alloy.

Japanese Laid-Open Patent Application 2001-15121 proposes a ternary alloy catalyst of the Pt—Ru—Mo system and the Pt—Ru—W system as the anode electrocatalyst capable of reducing the poisoning caused by CO in a reformed gas fuel. According to this reference, the reduction of Ru content is achieved while maintaining the effect of poisoning reduction achieved by the Pt—Ru alloy catalyst.

Japanese Laid-Open Patent Application 2001-15122 proposes a binary alloy catalyst of the Pt—W system for the anode electrocatalyst capable of reducing the poisoning caused by CO in a reformed gas fuel. According to this reference, it becomes possible to achieve the poisoning reduction effect similar to the one obtained by the Pt—Ru alloy catalyst without using expensive Ru.

As noted above, it has been a major subject in the conventional fuel cell technology to reduce the poisoning of platinum catalyst caused by CO, while this problem becomes a particularly serious problem in the case of using a reformed gas fuel in place of a hydrogen gas.

Generally, poisoning of a platinum catalyst is understood as the phenomenon in which electrons are back-donated from a platinum electrode to CO molecules and causing a strong adsorption of the CO molecules to the platinum electrode surface.

There is recognized existence of a strong dependence between a hydrogen oxidation activity current and CO coverage rate for a platinum electrode, and from this, it is understood that the phenomenon of CO poisoning of platinum catalyst is actually a surface reaction taking place between the CO molecules contained in the gas phase and the platinum surface. Thereupon, the conventional art of reducing the CO poisoning attempts to maintain the hydrogen oxidation activity of the platinum catalyst surface that has absorbed CO, by oxidizing the CO molecules by way of supplying OH-species thereto. In order to do so, the conventional technology provides a layer of atoms having strong oxygen affinity in the vicinity of the Pt—CO system formed in by the Pt catalyst surface by absorbing CO.

However, there still remain various problems not understood, such as migration of the CO molecules on the adsorbed surface, change of the electron state of the platinum surface covered with CO, and associated change of the coverage rate of CO, even in the case of such a surface reaction taking place in the catalyst metal-gas phase system. Thus, conventional technology cannot provide a quantitative solution to these various phenomena, and there exists no universal technology capable of eliminating the problem of poisoning of platinum catalyst.

In view of the situation noted above, there is emerging the need for a new technology of fuel cell different from the fuel cell of reformation fuel type, particularly in relation to miniaturization of the fuel cell.

In relation to this, a new-type fuel cell called direct methanol fuel cell (DMFC) is drawing attention, wherein DMFC is a fuel cell that conducts power generation with a construction similar to that of a PEFC, except that methanol is supplied directly to the anode for anode oxidation reaction.

A direct methanol fuel cell (DMFC), which is a fuel cell that supplies methanol directly to the anode, is a power generation device operated at a relatively low temperature (normal temperature to 120° C.).

In this fuel cell, which is studied for long time, the methanol fuel is supplied directly to the anode, and thus, the reformation device for extracting hydrogen from alcohol is no longer necessary. Thus, the device can be formed compact and low cost. Further, the overall operation means can be simplified.

Although there are various advantages in a direct methanol fuel cell, there exists also a problem in that the anode oxidation reaction of methanol provides a large overvoltage. In the oxygen-hydrogen fuel cell that uses hydrogen for the fuel, the oxidation rate of hydrogen is large and the oxygen reduction reaction in the cathode becomes the bottleneck. In the case of a direct methanol fuel cell, on the other hand, methanol oxidation becomes a major bottleneck, and the problem of decrease of output is not avoidable. Further, toxicity of methanol can not only harm the human health but also threaten the human life.

In spite of these apparent disadvantages, there exists great expectation in a liquid fuel cell in view of its safety and in view of the easiness of miniaturization of the fuel cell, as compared with the case of using a hydrogen gas fuel.

From the foregoing viewpoint, there have been proposed various fuel cells that use ethanol, dimethylether, propane, and the like, in place of methanol. However, such fuel cells cannot provide the output performance superior to the one obtained in the case methanol is used. Nevertheless, it is recognized that the use of ethanol, which provides little toxicity to human body and similarly little influence to the environment, is evidently most preferable for the fuel for use in a compact fuel cell for personal use.

It is known that a platinum electrode is suitable for electrode oxidation of ethanol. Further, it is also known that an alloy of Pt and Ru performs better (Souza, et al., J. Electroanalytical Chem. 420, pp. 17-20, 1997). Nevertheless, no satisfactory ethanol oxidation has been achieved even in the case the alloy of Pt and Ru is used for the electrode. Because of this, the development of highly efficient electrocatalyst suitable for use in the anode of the direct ethanol fuel cell and simultaneously capable of providing the output characteristic of the direct methanol fuel cell has been eagerly waited for.

The electrode reaction of a fuel cell includes an anode reaction and a cathode reaction.

The cathode reaction is usually an oxygen reduction reaction. Because the cathode reaction is unavoidable, it is required that the anode reaction is a faster reaction (higher rate reaction) than the cathode reaction. In other words it is desired that the anode reaction does not become the overall bottleneck of the electrochemical reaction taking place in the fuel cell.

In the case of using a hydrogen fuel, this demand is satisfied. Nevertheless, the handling of hydrogen fuel cell is complex as noted before, and a hydrogen fuel cell is inappropriate for the power supply of personal usage.

Liquid fuel is a promising candidate replacing hydrogen, and methanol is thought as the leading candidate the liquid fuel.

However, methanol has a problem of large overvoltage at the time of the anode oxidation in any of the cases when it is used alone or when it is used in the form mixed with water. Further, the current that can be taken out from the fuel cell does not reach the value obtained in the case of using hydrogen. In addition to this, ethanol or dimethylether is thought as promising candidates, but these fuels cannot provide the anode oxidation characteristic that exceeds the case in which methanol is used. This can be evidently seen when FIG. 2 in p. 258 of Lamy, et. al. J. Power Sources, 105, 2002, pp. 283-296, is compared with FIG. 8 in p. 806 of Lamy, et al., J. Appl. Electrochemistry, 31, pp. 799-809, 2001.

When the anode oxidation characteristic of methanol and the anode oxidation characteristic of ethanol are compared for the case of the fuel cell having a platinum catalyst, it is noted that there exists a remarkable difference with regard to the magnitude of anode current density, which is remarkably large as compared with the difference of the activation overvoltage. It is believed that this reflects the existence of complicated chemical reactions in the anode oxidation reaction in both of the cases of using methanol and ethanol for the fuel and the function of catalyst cannot be explained by a simple mechanism of CO poisoning as in case of the using a hydrogen gas for the fuel.

Thus, the catalyst poisoning occurring in a DMFC would be very much different from the CO poisoning caused in the case of using a reformation fuel gas.

Thus, the anode oxidation reaction caused in the case of using a fuel of alcohol or alcohol solution has a complicated aspect and cannot be explained by a simple surface reaction taking place between the catalyst metal and gas phase.

With regard to this issue, Zhu et al., Langmuir 2001, 17, pp. 143-154 and Wasmas, et al., J. Electroanalytical Chemistry 461, pp. 14-31, 1999 provide a representative theory. However, there is no established theory accepted by those persons skilled in the art.

Although there is proposed a model of molecule adsorption/desorption taking place at a platinum catalyst surface in FIG. 3, p. 22 of Wasmas, et al., op. cit., in relation to the direct anode oxidation reaction of the methanol, the understanding of adsorption species or the scheme of reaction varies variously among those skilled in the art.

What is common to these conventional references (Lamy, et al., op. cit., Lamy et al., op cit., Zhu, et al., op cit., Wasmas, et al., op cit.) is that there would exist the following electrochemical reactions in the anodic oxidation process of methanol, judging from the identification of adsorbed species and from the results of molecular spectroscopy of decoupled species.

In the case of the catalyst poisoning caused by CO contained with small amount in a reformed gas fuel, the species involved in the catalyst surface reaction are limited to $H_2$, the adsorbed CO molecules, and the catalyst itself, and the problem of the catalyst poisoning is described by the physical chemistry of the system including these species.

In the case of the direct anode oxidation of alcohol, however, the reaction becomes a liquid phase reaction taking place in a solution, irrespective of whether water is involved or not, and various molecular species can become the obstacle of the anode oxidation catalysis, in addition to CO. These species include the alcohol molecules, fragments of the alcohol molecules, and intermediate species and byproducts that are formed by the adsorption/desorption and the electrochemical reaction.

While there are several patent references noted before that assert that the Pt—Ru binary catalyst is effective for eliminating the poisoning, Gasteiger, et al., Electrochemica Acta, 39, 1994, pp. 1825 reports about the optimum content of Ru in this alloy catalyst as follows.

TABLE 2

| Optimum Ru content in Pt—Ru binary alloy catalyst | |
| --- | --- |
| 50 atm % | CO oxidation |
| 10 atm % | Methanol oxidation |

As can be seen in Table 2, the optimum Ru content in the Pt—Ru binary alloy catalyst is very much different between the case of the methanol oxidation and the case of the CO oxidation, and this strongly suggests that that the mechanism of the methanol oxidation is different from mechanism of the CO oxidation.

It has been understood that the oxidation of methanol becomes the bottleneck because the carbon monoxide formed during the process of electrode oxidation of methanol is adsorbed on the electrode and poisoning is caused in the electrocatalyst including platinum as a result. In order to solve this, therefore, various electrocatalysts have been studied. It is known that the problem of CO poisoning can reduced by using a Pt—Ru alloy. Even in this case, however, the reaction at the anode is still a bottleneck as compared with the oxygen reduction reaction taking place at the cathode.

In the representative technology shown in Japanese Laid-Open Patent Application 11-510311, which aims for the direct methanol fuel cell, it is noted that the technology merely follows the conventional technology developed for controlling the poisoning caused by CO in a reformation gas by using a binary catalyst.

With regard to the anode oxidation reaction of methanol, there exists no established theory about details of the reaction, even with reference to the foregoing references Lamy, et al., op cit., Lamy et al., op cit, Zhu, et al., op cit., and Wasmas, et al., op. cit.

Thus, one possible reaction process will be represented below for the case of using a Pt—Ru alloy catalyst.

At the anode, there occurs the reaction:

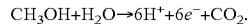
$$CH_3OH+H_2O \rightarrow 6H^+ + 6e^- + CO_2.$$

In this anode reaction, the processes below are involved:

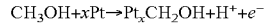
$$CH_3OH + xPt \rightarrow Pt_xCH_2OH + H^+ + e^-$$

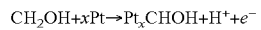
$$CH_2OH + xPt \rightarrow Pt_xCHOH + H^+ + e^-$$

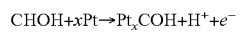
$$CHOH + xPt \rightarrow Pt_xCOH + H^+ + e^-$$

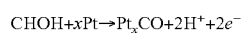
$$CHOH + xPt \rightarrow Pt_xCO + 2H^+ + 2e^-$$

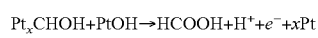
$$Pt_xCHOH + PtOH \rightarrow HCOOH + H^+ + e^- + xPt$$

In this reaction, it should be noted that COH (or HCO) or CO becomes a strong adsorption specie to platinum, while Ru provides the following effect to this adsorbed specie:

$$Ru+H_2O \rightarrow RuOH+H^++e^-$$

$$Pt_xCOH+RuOH \rightarrow CO_2+2H^++2e^-+xPt+Ru$$

$$Pt_xCO+RuOH \rightarrow CO_2+H^++e^-+xPt+Ru.$$

At the cathode, there takes place the reaction:

$$O_2+4H^++4e^- \rightarrow 2H_2O$$

Thus, even in the case of using methanol, in which only one carbon atom is contained, the anode reaction involves such complicated processes noted above. As ethanol includes two carbon atoms in the structure, the complexity of the anode oxidation reaction process would be incomparable with the foregoing anode oxidation reaction process for methanol.

For example, the description in Lamy et al., J. Appl. Electrochem. 31, pp. 799-809, 2001, op. cit., is easily understood by those skilled in the art.

The anode oxidation reaction of ethanol is represented as:

$$C_2H_5OH+3H_2O \rightarrow 12H^++12e^-+2CO_2.$$

These active species such as —COH, CO, —COOH and —CH$_3$, which are absorbed on the platinum surface cause the problem of poisoning, are formed from various dissociation species or intermediate species, such as CH$_3$—CH$_2$OH, CH$_3$CHO, CH$_3$COOH, and the like, formed during the anode electrochemical reaction of ethanol.

Thus, the anode oxidation reaction of ethanol is a complex reaction in which various elemental reactions and intermediate reactions are entangled. Because of this, the anode oxidation current of ethanol could not exceed the anode oxidation current of methanol as can be seen in Lamy, et al., op. cit. and Lamy, et al., op cit. Further, as can be seen in Fujita, et al., the Battery Debate Lecture, Abstract 42nd, pp. 590-591, 2001, there has been a situation that only one half or less of the power generation characteristic (output voltage, output density, and the like) of the direct methanol fuel cell is achieved for a single cell of the direct ethanol fuel cell, as long as a conventional Pt—Ru binary catalyst is used. Thus, the technology of direct ethanol fuel cell has not reached the level of practical use yet, apart from its theoretical possibility.

In spite of its lower electrode oxidation rate as compared with a methanol fuel cell, there exists enormous expectation on a compact portable fuel cell for personal use that is most suitably realized by using ethanol for the fuel, in view of various aspects of safety and easiness of sales to the public. However, there has been no known electrocatalyst that can reduce the overvoltage of the reaction and simultaneously increase the current density while using ethanol for the fuel. Thus, there has been a keen demand for such an electrocatalyst suitable for use in a direct ethanol fuel cell.

SUMMARY OF THE INVENTION

Thereupon, the general object of the present invention is to provide a novel and useful fuel cell that eliminates the foregoing problems.

Another and more specific object of the present invention is to provide a direct ethanol fuel cell capable of providing higher electromotive force (EMF) and higher output by using an electrocatalyst that can reduce the overvoltage and increase the current density.

Another object of the present invention is to provide an electronic device that uses such a direct ethanol fuel cell.

Another object of the present invention is to provide an electrocatalyst for ethanol oxidization comprising an elemental mixture containing platinum and at least one element selected from the group consisting of tungsten, tin, molybdenum, copper, gold, manganese, and vanadium.

According to the feature of the present invention, it becomes possible to improve the output current density of a direct ethanol fuel cell by using an electrocatalyst of an elemental mixture containing platinum and at least one element selected from the group consisting of tungsten, tin, molybdenum, copper, gold, manganese, vanadium.

According to the present invention, it becomes also possible to increase the output current density of a direct ethanol fuel cell by using an electrocatalyst of an elemental mixture containing platinum, ruthenium and at least one element selected from the group consisting of tungsten, tin, molybdenum, copper, gold, manganese, vanadium.

According to the present invention, it becomes possible to realize a mechanically and chemically stable electrocatalyst by providing the elemental mixture in the form of a multi-component alloy.

According to the present invention, it becomes possible to provide an extremely efficient direct ethanol fuel cell having reduced overvoltage at the electrode and significantly improved output current density, by using an electrocatalyst of an elemental mixture containing platinum and at least one element selected from the group consisting of tungsten, tin, molybdenum, copper, gold, manganese, vanadium. Because it can make use of ethanol, which has little toxicity and easily available, for the fuel in the fuel cell of the present invention, it becomes possible to use the fuel the fuel cell in the industrial fields conventionally not conceivable. Also, ethanol is easily produced from biomass, selection, acquisition and transport of the fuel is made easily. Thus the cost of the fuel cell of the present invention is reduced.

According to the present invention, it becomes possible to provide a highly efficient direct ethanol fuel cell having reduced overvoltage at the electrode and significantly improved output current density, by using an electrocatalyst of an elemental mixture containing platinum and ruthenium and at least one element selected from the group consisting of tungsten, tin, molybdenum, copper, gold, manganese, vanadium. Because it can make use of ethanol, which has little toxicity and easily available, for the fuel in the fuel cell of the present invention, it becomes possible to use the fuel the fuel cell in the industrial fields conventionally not conceivable. Also, ethanol is easily produced from biomass, selection, acquisition and transport of the fuel is made easily. Thus the cost of the fuel cell of the present invention is reduced.

According to the present invention, it becomes possible to obtain a desired output voltage from a fuel cell by stacking the direct ethanol fuel cells. Further, the cost of the fuel cell is reduced to be equal to or less than the cost of a conventional fuel cell. Further, it becomes possible to provide wide variety of fuel cells with regard to the power, size, constitution, and the like.

According to the present invention, it becomes possible to obtain a flat and compact fuel cell by arranging direct ethanol fuel cells in a two-dimensional array. Further, the cost of the fuel cell is reduced to be equal to or less than the cost of a conventional fuel cell. Further, it becomes possible to provide wide variety of fuel cells with regard to the power, size, constitution, and the like.

According to the present invention, it becomes possible to drive various electronic devices by using ethanol, which is free from toxicity and easily available, for the fuel of a fuel cell. Because of the easiness of handling ethanol, the fuel container can be designed variously according to the needs. Thus, the direct ethanol fuel cell of the present invention can be designed not only for apparatuses for industrial applications such as electric apparatuses, electronic apparatuses, precision apparatuses, and the like, but also for apparatuses of daily life including education and welfare.

DETAILED DESCRIPTION OF PREFERRED EMBODIMENT

First Embodiment

First, the structure of the fuel cell of the present invention will be explained in relation to the construction and operation of the present invention.

Figure 1:
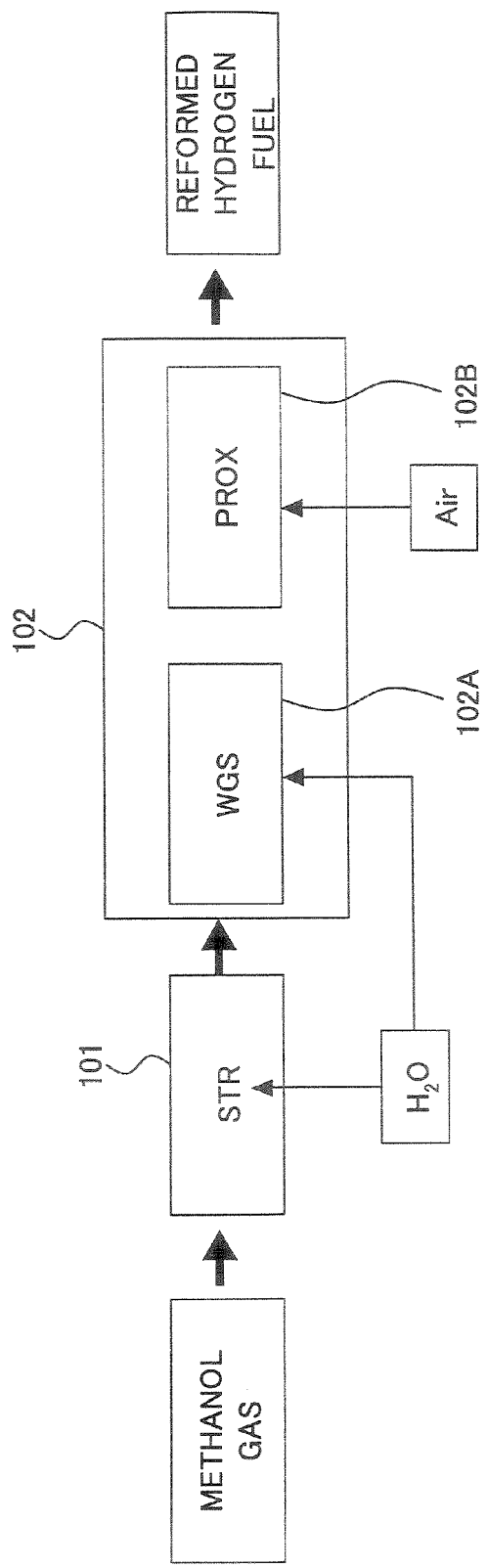
FIG. 1 is a diagram showing a conventional methanol reformation process.
Figure 2:
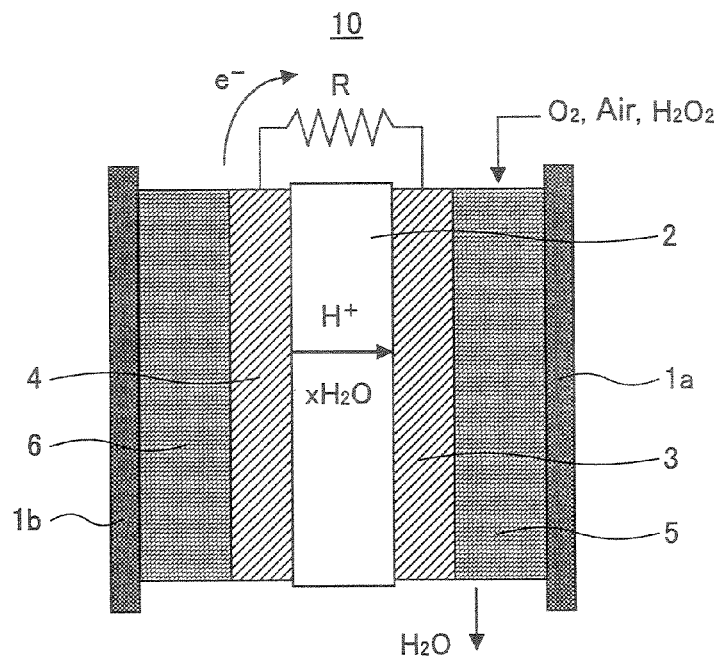
FIG. 2 is a diagram showing the construction of the direct ethanol fuel cell according to a first embodiment of the present invention.

FIG. 2 is a schematic diagram of a single cell structure constituting a single cell element of a general fuel cell, wherein the cell structure of FIG. 2 is used also in the present invention. Thus, FIG. 2 shows the construction of a direct ethanol polymer electrolyte fuel cell (PEFC) 10 according to an embodiment of the present invention.

Referring to FIG. 2, the PEFC 10 of the present invention includes an ion exchange membrane 2, a cathode 3 that supports the ion exchange membrane 2 and an anode 4 in a housing represented by the numerals 1a and 1b, wherein there are further provided with an oxidizer channel 5 and a liquid fuel storage part 6 at the respective outer sides of the cathode 3 and the anode 4.

Any of anion conduction type and cation conduction type can be used for the ion exchange membrane 2, wherein the membrane of proton conduction type is used most suitably for the ion exchange membrane 2. Any known material including polymer membrane such as perfluoroalkylsulfonate polymer can be used for the ion exchange membrane 2.

The cathode 3 and the anode 4 can be formed of a porous carbon paper applied with respective catalysts. It should be noted, however, that the cathode 3 and the anode 4 are by no means limited to such a porous carbon paper but any other porous material having electron conductivity can be used as long as the porous material does not block the diffusion of liquid fuel or oxidizer. By sandwiching the electrolyte membrane 2 between the cathode 3 and the anode 4, or by jointing the cathode 3 and the anode 4 at respective sides of the membrane 2 by hot press or casting, there is formed a membrane-electrode structure called MEA (Membrane Electrode Assembly). According to the needs, the porous carbon paper may be added or stacked with a water repellent such as polytetrafluoroethylene.

The anode 4 contains the electrocatalyst for ethanol oxidation with an effective component. Thus, for the anode 4, an element mixture of platinum or platinum and ruthenium and at least one element selected from tungsten, tin, molybdenum, copper, gold, manganese, vanadium is used in the form of a multicomponent alloy. In this electrocatalyst, it is desirable that the atomic ratio of platinum and the element other than platinum is set to 35:65-90:10. The electrocatalyst that formed of these elements may be a single crystal material, polycrystal material, amorphous material or an assembly of fine particle cluster of the respective elements.

Such an electrocatalyst can be used by itself or in the form carried by a suitable conductive support body when forming the anode. For the conductive support body, it is possible to use a thin metal film of gold, platinum, stainless steel, nickel, and the like, mesh or sponge of conductive material, or alternatively a known conductive particle of carbon, titanium oxide, silica, tin oxide, and the like.

Further, such a carrying structure of electrocatalyst can be formed by a PVD process such as sputtering, vacuum deposition, vacuum evaporation process in a gas, or a vacuum thin-film formation process such as known CVD process including a thermal CVD process, or alternatively by a chemical or electrochemical process such as electroplating process, electroless plating process or impregnation process. Further, it is possible to use a fine particle formation process such as vacuum arc melting process or mechanical milling process, and the like.

The anode material thus produced can be contacted to the ion exchange membrane 2 as it is. Alternatively, such an anode material can be contacted to the ion exchange membrane 2 together with an ion conduction material according to the needs.

For the additives thus used according to the needs, a conductive material such as carbon or a water repellent such as tetrafluoroethylene can be used. As for the ion conduction material, any material having ion conductivity can be used. Particularly, a desirable result is obtained by using the same material as the ion exchange membrane 2 for the ion conduction material. For the method of causing that anode 4 to make a contact with the ion exchange membrane 2, various known methods such as hot pressing, casting film formation method, and the like, can be used.

Further, the cathode 3 is formed in many cases by causing carbon particles carrying thereon platinum to make a contact with the ion exchange membrane 2, after thoroughly mixed with the ion conduction material. When the ion conduction material is the same material as the ion exchange membrane 2, a most desirable result is obtained. With regard to the method of contacting the cathode 3 with the ion exchange membrane 2, various known processes such as hot pressing, casting, and the like, can be used. Further, it is possible to use, in addition to the carbon particles, any known construction that uses a noble metal or a structure that carries such a noble metal (electrocatalyst), or an organic metal complex or a material in which the organic metal complex is sintered.

At the side of the cathode 3, there is provided an oxidizer inlet (not shown) for introducing oxidizer such as the air at the upward part of the fuel cell, while there is also provided a oxidizer outlet (not shown) at the downward part for discharges the unreacted air and the product (water in many cases). Further, it is possible to provide a compulsory suction mechanism and a compulsory exhaust mechanism (not shown). Further, it is possible to provide a convection hole of the air in the case 1a.

At the outside of the anode 4, there is provided a liquid fuel storage part 6. While the liquid fuel storage part 6 may be a part that stores the ethanol fuel, this can also be a flow path communicating with an external fuel storage part (not shown). In this case, the fuel is stirred by the natural convection and/or the compulsorily induced convection. Thus, it is possible to provide a compulsory convection means according to the needs.

For the fuel that is supplied directly to the anode 4, it is preferable to use ethanol alone or a mixture of ethanol and water. By using the mixture of ethanol and water, in particular, the crossover is prevented effectively, and the cell electromotive force (EMF) and the output are improved further.

Although FIG. 2 merely shows the concept of direct alcohol fuel cell for the case of single cell structure, the construction of FIG. 2 can be used also in practice. Further, a plurality of such cells can be used in parallel or serial connection. Thereby, the fuel cells can be connected by using a known bipolar plate as practiced conventionally, wherein the bipolar plate may be any of the one formed of a graphite plate machined with grooves for the fluid passage, the one formed of a mixture of carbon material such as graphite and a heat-resistant resin, or the one formed of a metal sheet such as stainless steel provided with an oxidation-resistant coating and a conductive coating. Alternatively, it is possible to use a planar interconnection structure such as the one disclosed in 2000 Fuel Cell Seminar Abstracts, pp. 791-812. Further, any other known interconnection structure may be used.

Second Embodiment

Figure 3:
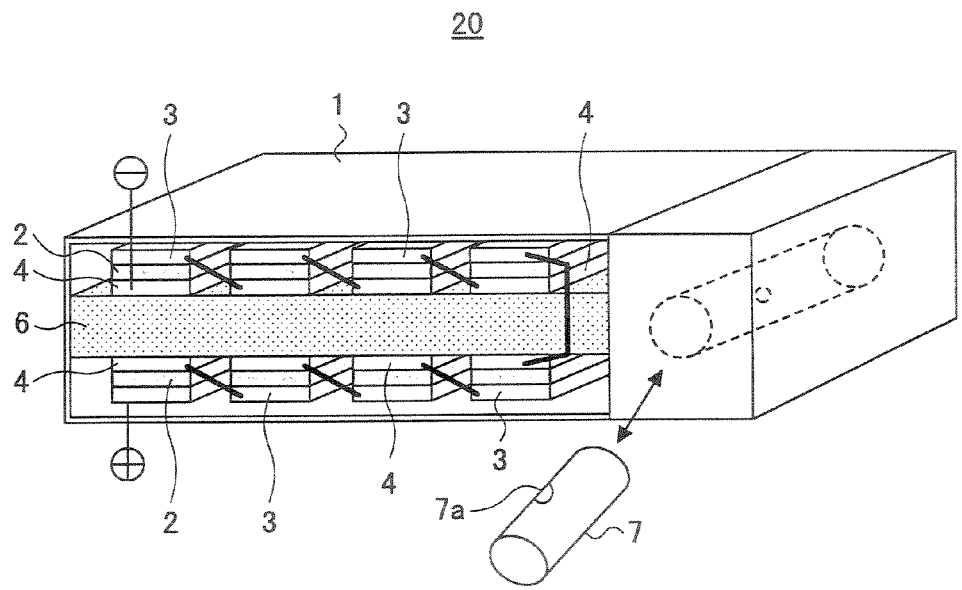
FIG. 3 is a diagram showing the construction of a direct ethanol fuel cell according to a second embodiment of the present invention.

FIG. 3 is a schematic diagram showing the construction of a PEFC 20 according to a second embodiment of the present invention.

Referring to FIG. 3, it can be seen that the PEFC 20 of the present embodiment has a generally flat rectangular shape.

Within the PEFC 20, there is formed a fuel supply path 6 so as to divide the interior of the PEFC 20 to an upper part and a lower part, and there is further provided a storage part of the liquid fuel in the form of a cylindrical container 7.

It should be noted that the container 7 is provided detachably to the body of the PEFC 20 and the fuel stored in the container 7 is supplied to the fuel supply path 6 through a small hole 7a formed in the sidewall of the container 7. The hole 7a is closed by a seal (not shown) in the state before the container 7 is mounted inside the body of the fuel cell and the ethanol fuel is sealed in the container 7. It should be noted that the small hole 7a is formed in the position where the small hole 7a communicates with the fuel supply path 6 in the state the container 7 is mounted on the fuel cell.

As can be seen in FIG. 3, the PEFC 20 of the present embodiment includes two or more cells.

In more detail, four cells forming a first cell group are disposed above the fuel supply path 6 and four cells forming a second cell group are disposed below the fuel supply path 6. Each of the cells is provided independently from each other and is formed of an anode 4, a cathode 3 and an electrolyte membrane 2 disposed between the cathode 3 and the anode 4. In each group, the cells are arranged in a planar state are connected in series.

It should be noted that the cells of the first and second groups are arranged such that the respective anodes 4 face with each other across the fuel supply path 6. Along with this, the cathodes are disposed at the respective outer sides in the first cell group and the second cell group. By arranging the cells like this, the fuel cell is easily miniaturized and a compact power supply suitable for portable devices is obtained. Because the container 7 containing the fuel is detachable, replenishment of the fuel is made easily in the present invention. From this aspect, too, the fuel cell of the present embodiment is suited for the power supply of portable devices.

With regard to the supply of fuel from the container 7 to the fuel supply path 6, it should be noted that a fuel containing ethanol as the principal component is supplied in a liquid state. In the case a polymer fiber or a polymer porous membrane is used, it is required that the polymer fiber or polymer porous membrane does not cause deformation when contacted with the fuel.

In FIG. 3, it is desirable to dispose a member having a fuel block function between the cells adjoining in the lateral direction from the point of preventing the unreacted fuel from reaching the cathode 3 (a kind of crossover). For example reaching of the fuel to the cathode 3 can be blocked by filling the gap between adjacent cells by an inorganic oxide film such as glass or alumina, or a polymeric material such as polyethylene or polypropylene.

As noted before, the cathodes 3 are disposed at the outer side in each of the cell groups. Thus, the cathodes 3 are facing the case 1. Further, there is provided a space between the cathode 3 and the case 1, and the air is caused to flow through such a space by natural convection. Thereby, oxygen (oxidizer) is supplied from the exterior of the fuel cell to the cathode. In the case of controlling the supply of the air to the cathode 3, it is possible to provide a compulsory convection means such as a fan to a fixed part of the case.

It should be noted that the materials the same as those used in the case FIG. 2 are used also in the PEFC of FIG. 3.

It should be noted that the present invention is not limited to the above-mentioned modes of FIGS. 2 and also 3, which are merely presented for explaining the present invention. Thus, any known methods and arrangements can be used with regard to the construction, arrangement, and interconnection of the respective cells.

EXAMPLES

Next, the present invention will be explained in detail by way of examples, while it should be noted that the present invention is not limited at all by such specific examples.

Comparative Example 1

A lead part is formed by welding a gold wire of 0.2 mm diameter to a gold foil (0.05 mm thickness) having a diameter of 6 mm. The electrode of Comparative Example 1 is then formed by forming a platinum layer ($Pt_{100}$) at both sides of the gold foil by a sputtering process with a thickness of about 0.1 μm. Further, a test solution was prepared by adding ethanol to a sulfuric acid solution of 1N concentration such that the concentration becomes 1 mol/liter. Further, an electrochemical measurement of ethanol oxidation was conducted on this test solution by a potential control method by using the electrode of Comparative Example 1 as the working electrode and with a platinum wire as the counter electrode, while using Ag/AgCl for the reference electrode. During the measurement, the measurement was conducted with the potential scanning rate of 10 mV/s.

Examples 1 and 2 and Comparative Example 2

A platinum-tungsten alloy layer ($Pt_{85}W_{15}$) of about 0.1 μm in thickness was formed on the same gold base of Comparative Example 1 by using a carousel type multi-source sputtering apparatus (ANELVA L-350-S-C). In this experiment, the thin film formation is conducted by radio frequency (RF) sputtering, after reverse sputtering the gold base for one minute with radio frequency (RF) electric discharge of 100 W and further by pre-sputtering the sputtering target for about one minute under the pressure of 10 Pa.

In more detail, the desired alloy film was obtained by heating the base body of gold to the temperature of 300° C. and rotating (the base body of gold) with 60 rpm rotation rate for facilitating alloying of the sputtered particles from respective sputtering sources and applying a RF power of 150 W to the Pt target for controlling the alloy composition and a RF power of 50 W to W target.

Similarly, a platinum-ruthenium-tungsten alloy layer ($Pt_{65}Ru_{20}W_{15}$) is obtained by heating the base body to the temperature of 300° C. and rotating with 60 rpm simultaneously applying a RF power of 300 W to the Pt target, a RF power of 150 W to the Ru target and a RF power of 100 W to the W target.

Furthermore, a desired platinum-ruthenium alloy layer ($Pt_{50}Ru_{50}$) was obtained similarly by applying a RF power of 150 W to the Pt target and a RF power of 50 W to the Ru target.

The platinum-tungsten alloy layer ($Pt_{85}W_{15}$) thus obtained was used for the electrode of Example 1 and the platinum-ruthenium-tungsten alloy layer ($Pt_{65}Ru_{20}W_{15}$) was used for the electrode of Example 2, while the platinum-ruthenium alloy layer ($Pt_{50}Ru_{50}$) was used for the electrode of Comparative Example 1.

By using these electrodes, electrochemical measurement was conducted similarly to Comparative Example 1.

Figure 4:
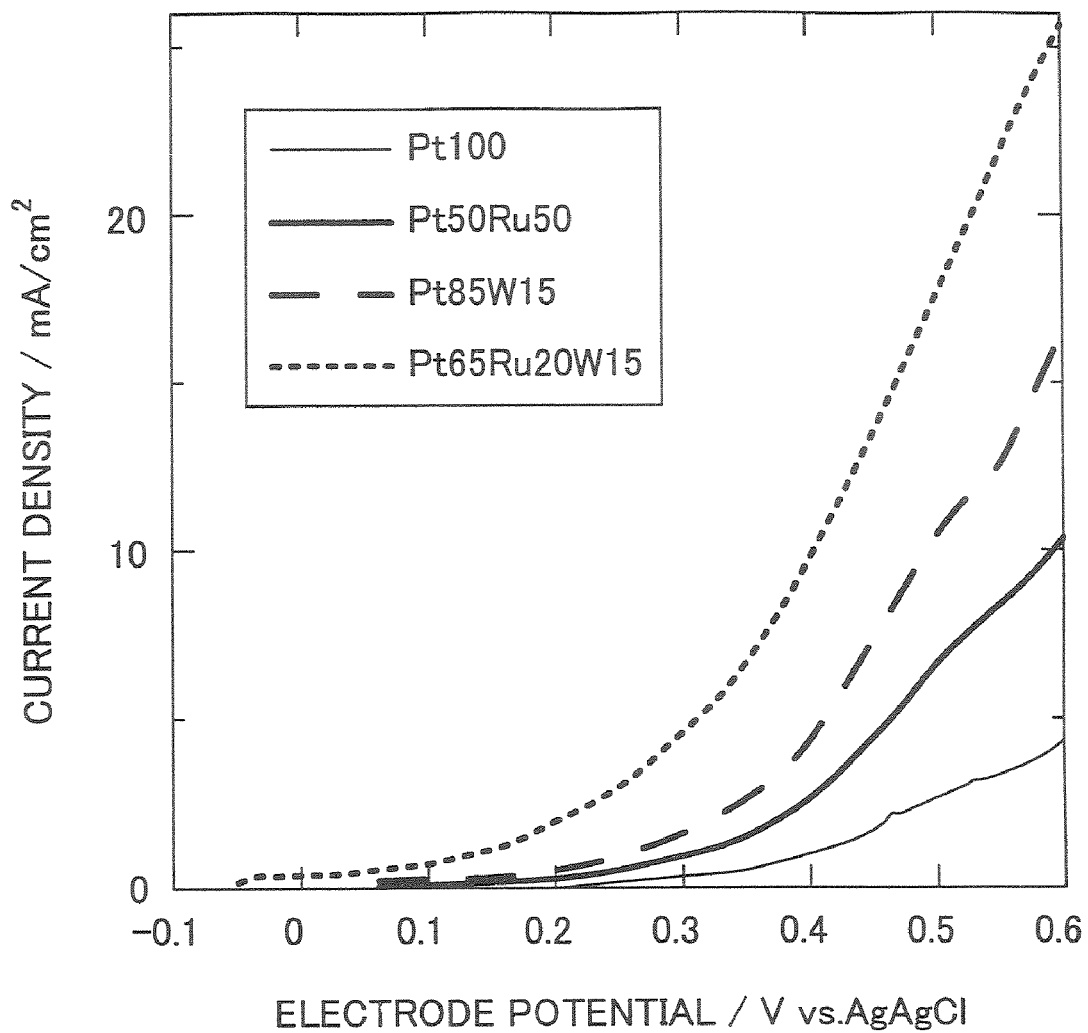
FIG. 4 is a diagram showing a current-potential curve of Examples 1-2 and also Comparative Examples 1-2 of the present invention.

FIG. 4 shows the current—potential curve thus measured. It can be seen that a larger current density is observed in the case the electrodes of Examples 1 and 2 of the present invention are used as compared with the case in which known electrode (electrodes of Comparative Examples 1 and 2) are used for the electrode of ethanol oxidation at the same electrode potential. Further, it can be seen that the electrode potential in which the current starts to flow is shifted in negative direction, indicating that the electrode of the present invention shows an excellent performance to the ethanol oxidation.

Examples 3-9 and Comparative Example 3

In the experiments of Examples 3-9 and Comparative Example 3, electrode oxidation of ethanol was conducted similarly to the case of Example 1 except that the layer of alloy electrocatalyst shown in Table 3 is provided on a base material shown also in Table 3. Thereby, the RF power applied to the sputtering target at the time of sputtering process was adjusted at the time of formation of the alloy electrocatalyst such that a desired alloy composition is prepared by the sputtering process conducted under the condition similar to the aforementioned Embodiments 1-2 or Comparative Examples 1-2.

As for the evaluation, measurement of natural potential (opening potential for the case where there flows no current: a large negative value is preferred) was made and current density for the case of 0.4V vs Ag/AgCl (larger the better) was the compared with the result of Comparative Example 3. The result of Evaluation is summarized also in Table 3.

TABLE 3

|  | Base | catalyst |  |
| --- | --- | --- | --- |
| Comparative Ex 3 | Si | Pt50Ru50 |  |
| Example 3 | Si | Pt85W15 |  |
| Example 4 | Si | Pt80Sn20 |  |
| Example 5 | Si | Pt65Ru20W15 |  |
| Example 6 | Au | Pt60Ru15Sn25 |  |
| Example 7 | Pt | Pt85W15 |  |
| Example 8 | Pt | Pt65Ru20W15 |  |
| Example 9 | Pt | Pt60Ru15Sn25 |  |

| | Evaluation | | | |
| --- | --- | --- | --- | --- |
| | Natural potential V vs Ag/AgCl | Judgment | Current density mA/cm$^2$ | judgment |
| Comparative Ex 3 | 0.00 | — | 2.5 | — |
| Example 3 | −0.07 | ○ | 3.6 | Δ |
| Example 4 | −0.07 | ○ | 6.6 | ○ |
| Example 5 | −0.05 | ○ | 4.9 | ○ |
| Example 6 | −0.09 | ○ | 2.6 | Δ |
| Example 7 | −0.01 | Δ | 5.0 | ○ |
| Example 8 | −0.05 | ○ | 9.2 | ⊚ |
| Example 9 | −0.08 | ○ | 3.2 | Δ |

Referring to Table 3, Δ represents moderate improvement, ○ represents improvement while ⊚ represents significant improvement.

From the result of Table 3, it is evident that the electrocatalyst of the present invention provides superior performance of ethanol oxidation as compared with the alloy composition known conventionally.

Example 10

Hereinafter, the result of characterization of the multicomponent alloy catalyst of the present invention will be shown for the composition and structure as Example 10. In the present embodiment, a multicomponent alloy formed by sputtering is presented as a typical example.

Figure 5:
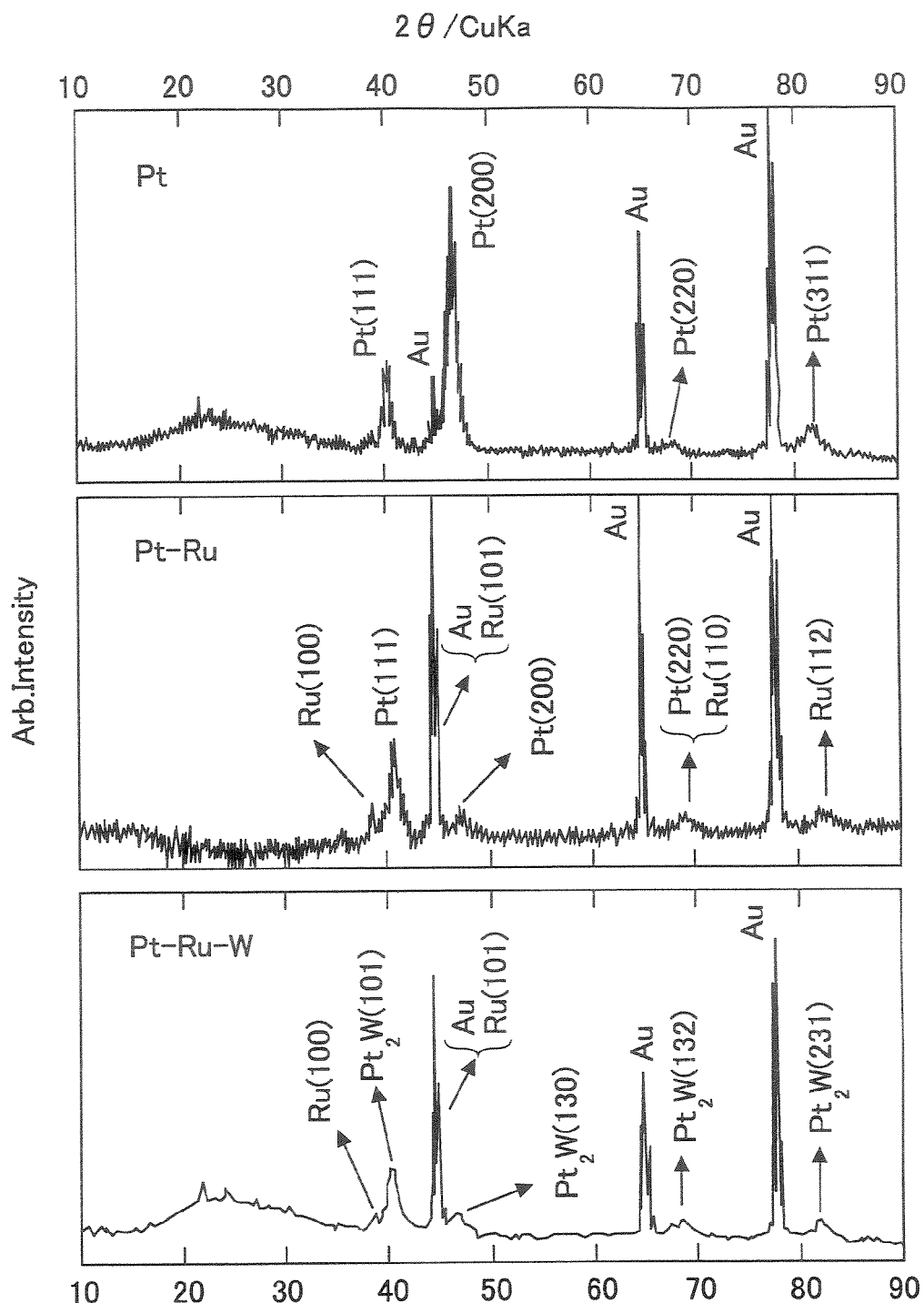
FIG. 5 is a diagram showing the XRD pattern of Pt, Ru, W and a multicomponent alloy.

FIG. 5 shows the result of analysis of the crystal structure of the catalyst layer by XRD (X-ray diffraction) method.

Referring to FIG. 5, it can be seen that the catalyst layer of the Pt show a diffraction peak of fcc (face centered cubic) structure. Although not illustrated in FIG. 5, similar XRD analysis reveals that the catalyst layer of the Ru has an hcp (hexagonal closest packing) structure. Further, it was confirmed that the catalyst layer of the W has a ccp (cube closest packing) structure.

In the case of the Pt—Ru binary catalyst layer, the peak of Pt and Ru are basically observed although the peak position is shifted slightly from the characteristic peak of the simple metal. Thereby, peak of Pt is the strongest. From this result, it was discovered that the aforementioned Pt—Ru alloy phase, while maintaining the fcc structure peculiar to Pt, forms a solid solution of Pt and Ru as a result of addition of Ru.

With regard to the ternary catalyst metal of Pt—Ru—W, it is easily inferred, from the fact that the peak of the orthorhombic structure of $Pt_2W$ appears more strongly than the characteristic peak of Ru, that $Pt_2W$ and Ru are distributed in the form of a solid solution as can be seen in FIG. 5.

Further, similar analysis and evaluation were made on the multicomponent alloy catalyst of the present invention shown in Table 3.

Table 4 shows the evaluation result of element composition for the primary multicomponent alloy catalyst of the present invention represented in terms of mole fraction.

TABLE 4

| Pt-metal alloy | XRF composition (mol %) | EPMA composition (mol %) |
|---|---|---|
| Pt—Ru | $Pt_{80}Ru_{20}$ | $Pt_{67}Ru_{33}$ |
| Pt—W | $Pt_{75}W_{25}$ | $Pt_{67}W_{33}$ |
| Pt—Sn | $Pt_{80}Sn_{20}$ | $Pt_{85}Sn_{15}$ |
| Pt—Ru—W | $Pt_{65}Ru_{20}W_{15}$ | $Pt_{65}Ru_{23}W_{12}$ |
| Pt—Ru—Sn | $Pt_{60}Ru_{25}Sn_{15}$ | $Pt_{71}Ru_{22}Sn_7$ |

Referring to Table 4, it can be seen that the result of fluorescent X-ray analysis agrees fairly well with the result of EPMA (electron probe micro analyzer). Further, it was confirmed from the two dimension distribution mapping data of element obtained by EPMA that Pt and Ru, and Pt and W distribute fairly uniformly and form a solid solution phase of $Pt_2W$ and Ru.

Thus, it was confirmed that the electrode catalyst of the present invention forms an alloy composition containing a solid solution phase as in the case of the Pt—Ru—W ternary catalyst formed by a sputtering process and it is conceivable that this alloy composition containing the solid solution phase contributes effectively to the anode oxidation reaction of the ethanol. It should be noted that this is the outcome of use of vacuum film formation process, which is a non-thermal equilibrium process.

According to other fabrication process explained in the present invention, it should be noted that the electrocatalyst composition can take an amorphous phase, polycrystal phase or a mixture of these. Further, it is easily understood that a similar effect is also achieved by using the effective compositional ratio of elements realized by multi-dimensional arrangement of fine particle clusters of the elements and a micro texture of the catalyst in the case a vacuum evaporation process in a gas or a wet process is used.

Third Embodiment

Figure 6:
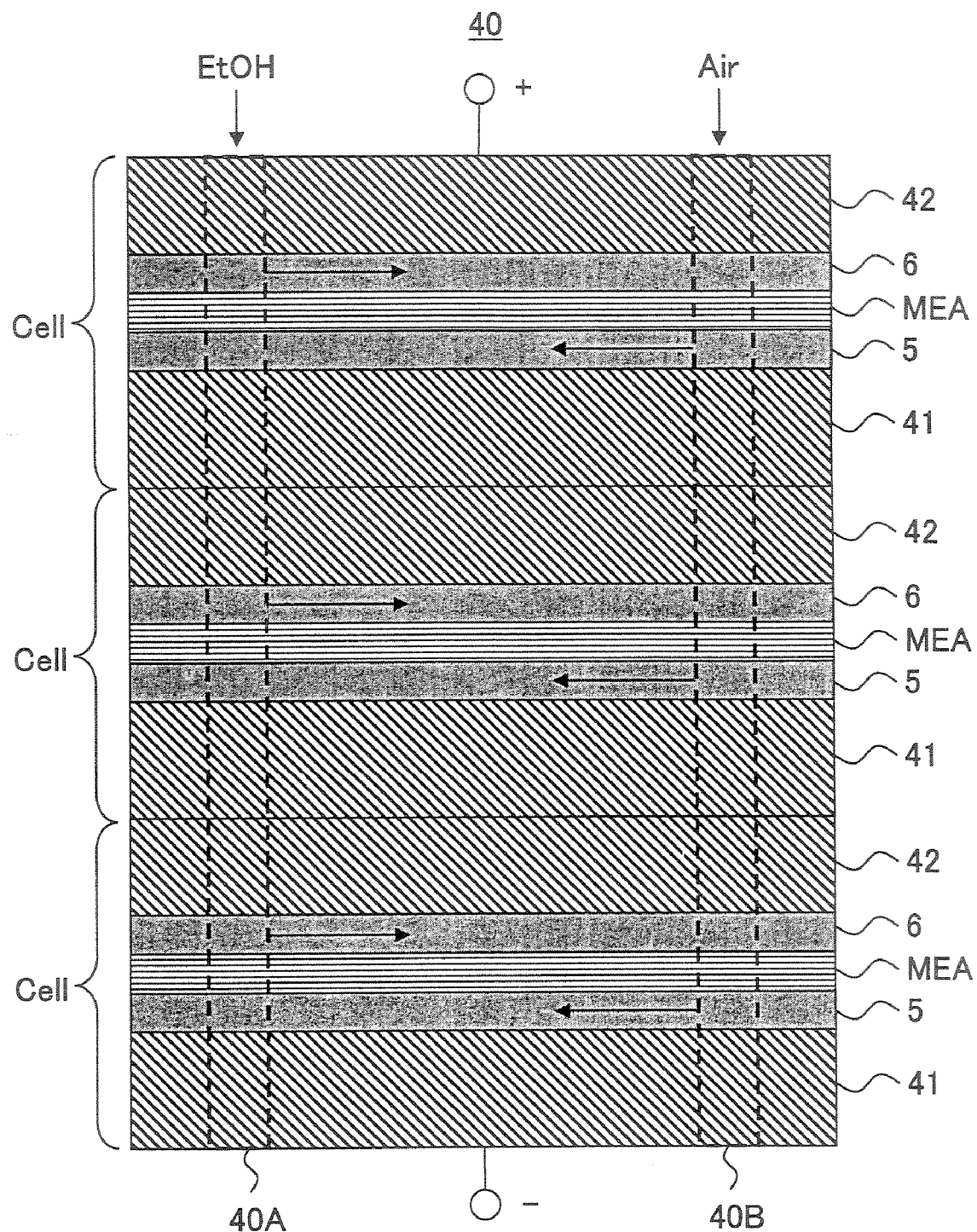
FIG. 6 is a diagram showing the construction of a battery (fuel cell power generator) in which a plurality of direct ethanol fuel cells are stacked.

FIG. 6 shows the construction of a PEFC 40 according to a third embodiment of the present invention in which a plurality of cells are stacked.

Referring to FIG. 6, the PEFC 40 has a structure including a plurality of cells stacked with each other, wherein each of the cells has a construction of an MEA similar to that of FIG. 2 and is formed of stacking of the cathode 3, the anode 4 and the electrolyte membrane 2. The MEA thus formed is sandwiched by porous membranes respectively constituting the oxidizer channel 5 and the liquid fuel channel 6, and each of the cells thus formed is sandwiched by a pair of bipolar plates 41 and 42 formed of a dense carbon film, and the like.

Furthermore, in the construction of FIG. 6, it should be noted that there is formed a supplying hole 40A of ethanol so as to penetrate through the foregoing stacked structure, and the ethanol fuel is supplied in each of the cells to the liquid fuel channel 6 from the ethanol supplying hole 40A. In the construction of FIG. 5, there is further provided an air supply hole 40B so as to penetrates through the foregoing stacked structure, the air is supplied to the oxidizer channel 5 from the air supplying hole 40B in each of the cells. In order to disperse the ethanol or the air thus supplied uniformly along liquid the fuel channel 6 or the oxidizer channel 5, there is formed a groove (not shown) at the inner side of the bipolar plates 41A and 41B.

In the PEFC 40 of the stacked type, too, a plurality of cells are connected in series, and as a result, it becomes possible to obtain a desired output voltage in correspondence to the number of the cells.

Example 11

In the present embodiment, various fuel cell power generation units of stacked structure having the bipolar plates as shown in FIG. 6 were produced experimentally by using the MEA shown in FIG. 2.

In the case of a passive-mode fuel cell power generation unit A1 in which the ethanol fuel and oxidizer are fed and discharged without compulsory means, it was confirmed that an output density for an average single cell has the value of 12-15 $mW/cm^2$.

With regard to a power generation unit B of the type provided with a compulsion convection means for the fuel and the oxidizer, it was confirmed that the average output density takes the value of about 42 $mW/cm^2$.

Further, it was shown that the power generation unit, in which the simple cell (effective cell area of 32 $cm^2$) of the foregoing power generation unit A1 is stacked 30 times, provides the output power of 12.5 W. This means that the power generation unit is suitable for use as the power supply of electronic devices and apparatuses having power consumption of about 10 W.

Furthermore, it was confirmed that an output power of about 43 W is obtained from a power generation unit A2 formed by stacking a plurality of cells, each having an effective cell area of 115 $cm^2$ and providing an output power density comparable to the simple cell of the above-mentioned power generation unit A1, for 30 times provides.

In the case of constructing a power generation unit by stacking the power generation unit B having the compulsory convection means (effective cell area of 128 $cm^2$) 30 times, on the other hand, an output of about 120 W was obtained excluding the power loss of 22% caused by the incidental devices.

Fourth Embodiment

In a fourth embodiment of the present invention, a power generation unit C was constructed by connecting the cells similar to the one explained with reference to Example 11 by the planar interconnection as shown in FIG. 3.

It should be noted that the power generation unit C thus constructed is a passive type apparatus and connects 25 cells each having the effective area of 18 $cm^2$ in series.

By supplying the ethanol fuel directly, it was confirmed that an output power of 4.3 W is obtained.

It should be noted that this power generation unit C is designed for use particularly in small or ultra-small electronic apparatuses as will be mentioned later.

Fifth Embodiment

Figure 7:
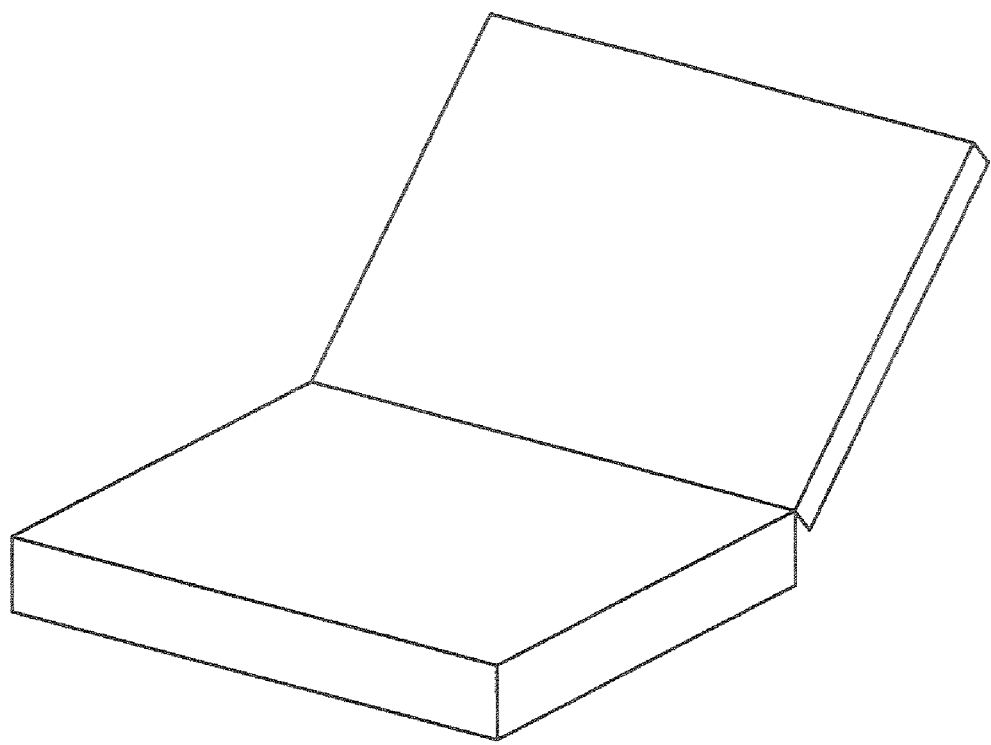
FIG. 7 is a diagram showing an example of an electronic apparatus that uses a fuel cell of the present invention.

FIG. 7 shows the construction of an electron device 80 according to a fifth embodiment of the present invention.

Referring to FIG. 7, the electron device 80 is a laptop computer and uses the PEFC 10, 20 or 40 explained with reference to the previous embodiments as a power pack. Thereby, a long time drive becomes possible. Because of the use of ethanol fuel, which is free from toxicity and easily obtained and can be handled without danger, the user of the electron device 80 can exchange or replenish the fuel easily without special equipment.

Example 12

A fuel cell system was constructed by using the power generation unit A2 explained with Example 11 by providing thereto a power conditioner (voltage regulators, etc.) and peripheral control apparatuses.

Further, the fuel cell system thus constructed is used in a small size personal computer for mobile use as the power supply. The mobile computer used in the present experiment was the one that uses Crusoe processor TM5800-1 GHz of Transmeta Corporation and is characterized by a small maximum power consumption of 40 W. It is estimated that the average electric power consumption is around 28 W.

In the experiment, power generation was made by using an ethanol liquid fuel. The ethanol fuel used in the experiment was an ethanol aqueous solution that contains about 3.8% weight of ethanol. The fuel cartridge was compact volume of 120 ml.

A specified output was obtained after 6 minutes from the activation of the power generation unit and it was possible to operate the mobile computer during the applicatory utilization continuously. While the power unit was constructed in the present experiment in the form of an external power supply, the present invention is by no means limited to such a specific construction and it is possible to design the fuel cell system in the type that is incorporated into the apparatus.

Similarly, the power generation unit C of Experiment 12 having the in-plane construction can be designed for use in ultra small electronic apparatuses including cellular phones, etc. Further, the electronic apparatuses mentioned above are merely examples and the present invention can be used in various electronic apparatuses including: desktop personal computers; lap top or notebook personal computers; workstations (computer); PDA (personal digital assistant); charging power supply for electronic apparatuses; PHS; cellular phones: GPS terminals; copying machines; facsimile apparatuses; ink jet printers; laser printers; e-book (electronic book) display; LCD monitor devices; liquid crystal projectors; projection type display apparatuses; IC card read/write terminals; non-contact IC card read/write terminals; media boards (white board); photo printers (sublimation type printer); digital still cameras; digital movie cameras; personal computer peripheral equipments such as the DVD drives; uninterruptible power supplies; emergency outdoor power supplies (for light projectors, etc.); camping power supplies; radio apparatuses; moving-type robots; entertainment robots; care back-up devices (care bed etc.); care back-up robots; electrically powered wheelchairs; electrically powered bicycles; medical treatment machines; distributed power supplies; electrically powered artificial limbs; automatic guided vehicles; electrical machinery; and apparatus for cooking.

By using ethanol for the fuel, easiness and safety of handling the fuel is improved significantly. Further, safety with regard to environment is improved as well as to the safety to human body.

Further, the present invention is not limited to the embodiments described heretofore, but various variations and modifications may be made without departing from the scope of the invention.

The present invention is based on the Japanese priority patent applications 2002-298138 and 2003-344727 filed respectively on Oct. 11, 2002, and Oct. 2, 2003, the entire contents of which are incorporated herein as reference.

What is claimed is:

1. A method of oxidizing ethanol comprising catalyzing the oxidation of ethanol with an electrocatalyst, wherein said electrocatalyst comprises an elemental mixture comprising platinum and at least one additional element, wherein the atomic ratio of platinum and said at least one additional element is from 35:65 to 90:10, wherein said at least one additional element comprises at least 10 atomic percent tungsten, wherein said at least one additional element further comprises ruthenium, and wherein said elemental mixture is in a form selected from the group consisting of an amorphous material, a solid solution, a single crystal material, a polycrystal material, a fine particle cluster material, a material having an assembly of fine particle clusters, an alloy, and a multi-component alloy.

2. The method of oxidizing ethanol according to claim 1, wherein said multi-component alloy is present and is one or more forms selected from the group consisting of an amorphous material, a solid solution, a single crystal material, a polycrystal material, a fine particle cluster material, and a material having an assembly of fine particle clusters.

3. The method of oxidizing ethanol according to claim 1, wherein said elemental mixture comprises from 60 to 65 atomic percent platinum and said at least one additional element comprises from 12 to 15 atomic percent tungsten and from 20 to 23 atomic percent ruthenium.

4. The method of oxidizing ethanol according to claim 3, wherein said multi-component alloy is present and is one or more forms selected from the group consisting of an amorphous material, a solid solution, a single crystal material, a polycrystal material, a fine particle cluster material, and a material having an assembly of fine particle clusters.

5. The method of oxidizing ethanol according to claim 1, wherein said at least one additional element further comprises one or more elements selected from the group consisting of tin, molybdenum, copper, gold, manganese, and vanadium.

6. The method of oxidizing ethanol according to claim 5, wherein said multi-component alloy is present and is one or more forms selected from the group consisting of an amorphous material, a solid solution, a single crystal material, a polycrystal material, a fine particle cluster material, and a material having an assembly of fine particle clusters.

7. The method of oxidizing ethanol according to claim 1, wherein platinum has a face centered cubic structure.

8. The method of oxidizing ethanol according to claim 1, wherein tungsten has a cube closest packing structure.

9. The method of oxidizing ethanol according to Claim 1, wherein ruthenium has a hexagonal closest packing structure.

10. The method of oxidizing ethanol according to claim 1, wherein catalyzing the oxidation of ethanol with an electrocatalyst occurs within a direct ethanol fuel cell, wherein said direct ethanol fuel comprises:
   a body;
   an electrolyte membrane disposed in said body and sandwiched between an anode and a cathode; and
   a fuel supply path provided in said body for supplying fuel comprising ethanol as a principal ingredient to said anode,
   wherein said anode is formed of said electrocatalyst comprising said elemental mixture comprising platinum and at least one additional element, wherein said at least one additional element comprises at least 10 atomic percent tungsten, and wherein said at least one additional element further comprises ruthenium.

11. The method of oxidizing ethanol according to claim 10, wherein said direct ethanol fuel cell is present within an electronic apparatus.

12. The method of oxidizing ethanol according to claim 1, wherein catalyzing the oxidation of ethanol with an electrocatalyst occurs within a direct ethanol fuel cell, wherein said direct ethanol fuel comprises:

a body;

a plurality of cells accommodated in said body, each of said plurality of cells being formed of an anode, a cathode, and an electrolyte membrane sandwiched between said anode and said cathode;

a fuel supply path provided in said body for supplying fuel comprising ethanol as a principal ingredient to said anode in each of said plurality of cells; and an oxidizer supply path provided in said body for supplying an oxidizer to said cathode in each of said plurality of cells, wherein said plurality of cells are stacked consecutively and alternately in said body with respective positive and negative poles being connected with each other via a bipolar plate, and wherein said anode in each of said plurality of cells is formed of said electrocatalyst comprising said elemental mixture comprising platinum and at least one additional element, wherein said at least one additional element comprises at least 10 atomic percent tungsten, and wherein said at least one additional element further comprises ruthenium.

13. The method of oxidizing ethanol according to claim 12, wherein said direct ethanol fuel cell is present within an electronic apparatus.

14. The method of oxidizing ethanol according to claim 1, wherein catalyzing the oxidation of ethanol with an electrocatalyst occurs within a direct ethanol fuel cell, wherein said direct ethanol fuel comprises:

a body;

a plurality of cells accommodated in said body, each of said plurality of cells being formed of an anode, a cathode, and an electrolyte membrane sandwiched between said anode and said cathode;

a fuel supply path provided in said body for supplying fuel comprising ethanol as a principal ingredient to said anode in each of said plurality of cells; and an oxidizer supply path provided in said body for supplying an oxidizer to said cathode in each of said plurality of cells, wherein said plurality of cells are arranged in a plane and connected in series in said body, wherein said anode in each of said plurality of cells is formed of said electrocatalyst comprising said elemental mixture comprising platinum and at least one additional element, wherein said at least one additional element comprises at least 10 atomic percent tungsten, and wherein said at least one additional element further comprises ruthenium.

15. The method of oxidizing ethanol according to claim 14, wherein said direct ethanol fuel cell is present within an electronic apparatus.

* * * * *